United States Patent [19]

Boyd et al.

[11] 4,077,023

[45] Feb. 28, 1978

[54] ELASTIC WAVEGUIDE

[75] Inventors: Gary Delane Boyd, Rumson; Robert Norton Thurston, Colts Neck, both of N.J.

[73] Assignee: Bell Telephone Laboratories, Incorporated, Murray Hill, N.J.

[21] Appl. No.: 745,097

[22] Filed: Nov. 26, 1976

[51] Int. Cl.² ........................ H03H 9/00; H03H 9/26; H03H 9/30; H01L 41/10

[52] U.S. Cl. ................................. 333/30 R; 310/333; 310/365; 333/71

[58] Field of Search .................... 333/30 R, 30 M, 29, 333/71, 95 R; 310/8, 8.1, 8.3, 8.4, 8.5, 8.6, 9.4, 9.5, 9.7, 9.8

[56] References Cited

U.S. PATENT DOCUMENTS

| | | | |
|---|---|---|---|
| 3,736,532 | 5/1973 | Armenakas | 333/30 R |
| 3,922,622 | 11/1975 | Boyd et al. | 333/30 R |

*Primary Examiner*—Alfred E. Smith
*Assistant Examiner*—Marvin Nussbaum
*Attorney, Agent, or Firm*—Ronald D. Slusky

[57] ABSTRACT

Elastic waves are propagated in a waveguide comprising an elongate central core region and an outer cladding region, the cladding region having a larger bulk shear elastic wave velocity than the core region. Transducers at respective ends of the waveguide couple between electrical signals and "shear" mode elastic waves in which the principal particle displacement is substantially perpendicular to a plane passing through the central longitudinal axis of the core region. The cladding region is sufficiently thick to ensure that the particle displacement profile is substantially zero at its outer surface. The waveguide is mounted in a medium suitable to mechanically support it and to protect it against external mechanical shock.

17 Claims, 12 Drawing Figures

ELASTIC WAVEGUIDE

BACKGROUND OF THE INVENTION

Our invention relates to elastic waveguides and, in particular, to guides for propagating elastic waves in inhomogeneous solids. Elastic waves in solid media are also commonly called acoustic, or ultrasonic, waves even though they are not audible to the human ear.

U.S. Pat. No. 3,922,622 issued to G. D. Boyd and L. A. Coldren on Nov. 25, 1975, which is hereby incorporated by reference, discloses a form of waveguide for acoustic waves. An illustrative embodiment of that waveguide comprises an elongated central core region and a core-enclosing region therearound, both regions being composed of materials in which elastic waves can be propagated. The two regions are so chosen that they focus and contain energy predominently within the core region. Advantageously, this waveguide has low propagation loss and low velocity dispersion over frequency bands of interest. In addition isolation from external supports is very good.

SUMMARY OF THE INVENTION

The Boyd-Coldren patent discloses that radial, torsional and longitudinal mode elastic waves can be propagated within the above-described waveguide. We have now discovered that elastic waves in yet a fourth set of modes—referred to herein as the "shear" modes—can also be propagated in the waveguide. The shear modes are characterized by a principal particle displacement which substantially is perpendicular to a plane passing through the central longitudinal axis of the core region. An illustrative embodiment of our invention, then, comprises a waveguide for elastic waves of the type disclosed in the Boyd-Coldren patent in combination with appropriate transducer structure for exciting and detecting the above-described shear mode elastic waves within the guide.

Advantageously, utilizing transducers which excite and detect shear mode elastic waves in accordance with the present invention, rather than the mode known heretofore, improves the operating characteristics of the waveguide in several significant respects. These include better guiding at a given frequency, a wider low-dispersion frequency band and a lower cutoff frequency for the fundamental, i.e., lowest guided, mode. The latter facilitates single mode excitation and allows the use of lower operating frequencies for a given core radius. This, in turn, minimizes propagation loss, which is frequency dependent. Moreover, transducers for exciting and detecting elastic waves in the fundamental shear mode are less expensive and are easier to fabricate than transducers for the modes known heretofore.

BRIEF DESCRIPTION OF THE DRAWING

The invention may be clearly understood from a consideration of the following detailed description and accompanying drawing in which.

DETAILED DESCRIPTION

Figure 1:
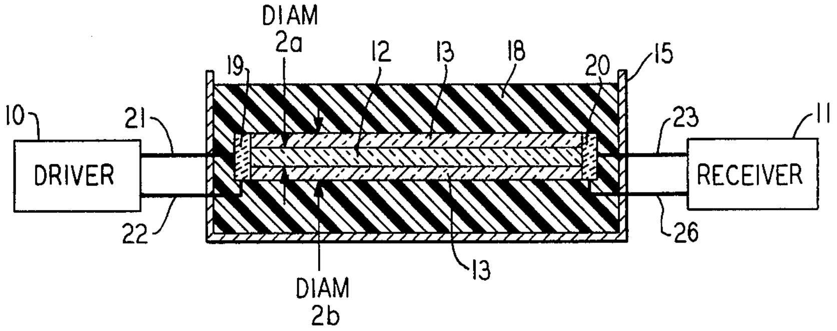
FIG. 1 is a simplified side sectional view of a waveguide of the type disclosed in Boyd-Coldren U.S. Pat. No. 3,922,622 in combination with transducers for exciting and detecting shear mode elastic waves in the waveguide in accordance with the present invention.

In FIG. 1, a waveguide of the general type disclosed in Boyd-Coldren U.S. Pat. No. 3,922,622 is illustrated as a delay line which is coupled between the output of a driver 10 and a receiver 11. Driver 10 may be a source of either digital or analog high frequency, e.g., 25–40 MHz, signals. Receiver 11 is any suitable utilization circuit appropriate to the signals provided by driver 10.

The waveguide delay line comprises an elongated core member, or fiber, 12 of radius *a* (diameter 2*a*) and an enclosing member, illustratively a layer of cladding material 13, which covers all surfaces of core 12 except its end surfaces. The cladding material radius is *b*. Both the core and the cladding are made of a material in which elastic waves can be propagated, such as fused silica, and the core and cladding materials are selected so that the bulk shear elastic wave velocity of the cladding is larger than that of the core. To this end, the fused silica used for the core material may, for example, be titanium doped. The core and cladding bulk shear velocities may be close to one another so that, advantageously, the waveguide will have low dispersion over a range of frequencies. However, the velocities should differ sufficiently (typically by 1–30 percent) to effect reasonable energy confinement, i.e. guiding. The core and cladding materials may also have substantially the same temperature coefficient of expansion in anticipated ranges of manufacturing and operating temperatures.

Electromechanical signal transducers 19 and 20, illustratively discrete devices, are bonded to the polished end surfaces of the waveguide using, for example, low viscosity, high hardness epoxy. Transducer 19 is adapted to launch in the waveguide elastic waves representing the successive time variations of electric signals applied to the transducer from driver 10 via leads 21 and 22. Transducer 20 provides the reverse function; it detects the elastic waves at the other end of the waveguide, converts them back to electrical form and extends them to receiver 11 via leads 23 and 26.

Figure 2A:
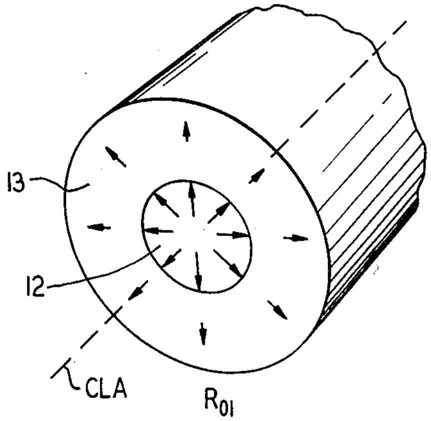
FIGS. 2A and 2B graphically depict the principal particle displacements of the heretofore known fundamental radial and torsional modes, respectively, of the waveguide of FIG. 1.
Figure 2B:
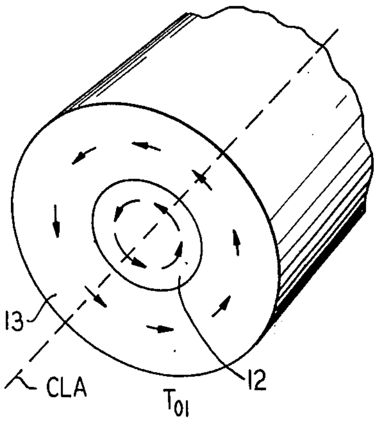

The Boyd-Coldren patent discloses that radial and torsional mode elastic waves can be excited ("launched") and detected in the waveguide by appropriately configuring transducers 19 and 20. As graphically depicted in FIG. 2A, the principal particle displacement of the fundamental radial mode $R_{01}$ is into and away from the central longitudinal axis CLA of core 12. In the fundamental torsional mode $T_{01}$, depicted in FIG. 2B, the principal particle displacement is azimuthual i.e., alternately clockwise and counterclockwise about axis CLA. The waveguide may also be excited in a longitudinal mode in which the principal particle displacement is linear in a direction parallel to axis CLA. This mode is not of particular practical interest, however, and will not be discussed further herein.

Figure 2C:
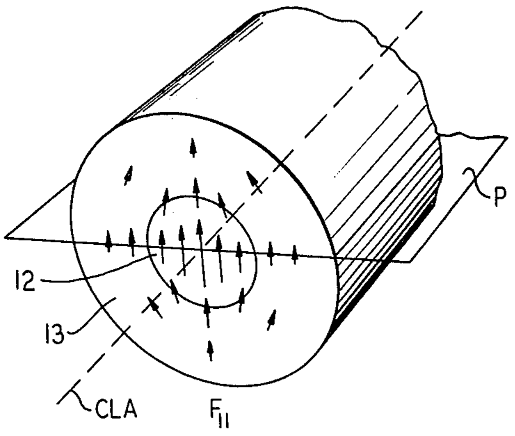
FIG. 2C graphically depicts the principal particle displacement of the fundamental shear mode of the present invention.

In accordance with the present invention, we have discovered that elastic waves in yet a fourth set of modes, herein referred to as the "shear" modes, can also be propagated in the waveguide of FIG. 1. The principal particle displacement of the shear modes is substantially linear in a direction substantially perpendicular to a plane P passing through central longitudinal axis CLA. As shown in FIG. 2C, the particle displacements are in phase throughout the waveguide for the fundamental shear mode $F_{11}$. For higher order shear modes, by contrast, the particle displacements at any point in time are at differing points in their "up and down" (as viewed in FIG. 2C) travel in various regions of the guide cross section. Transducer arrangements for exciting and detecting the fundamental shear mode are discussed hereinbelow.

Figure 3:
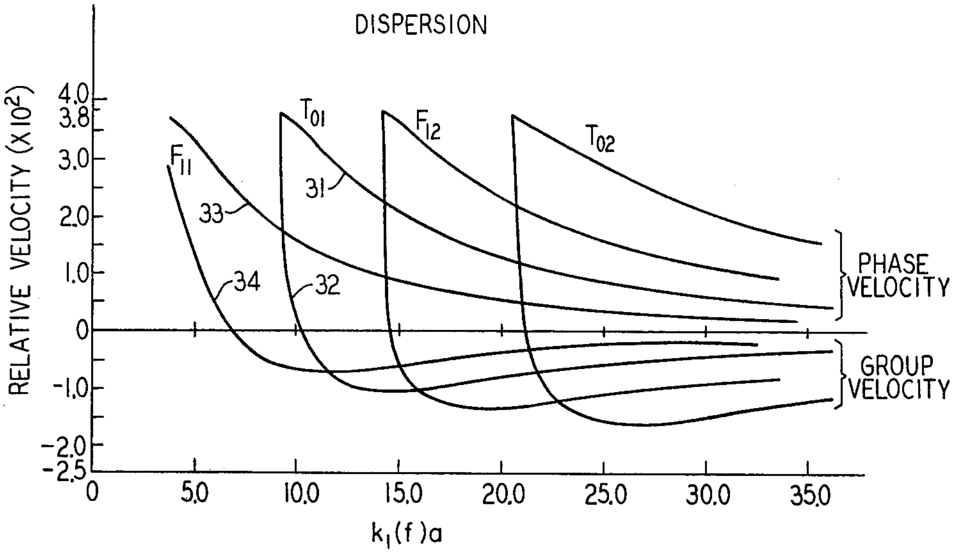
FIG. 3 depicts illustrative dispersion curves for two different torsional and two different shear modes of the waveguide of FIG. 1.

FIG. 3 shows illustrative dispersion curves for several modes of the waveguide of FIG. 1. These curves plot relative phase and group velocities as a function of the product of core 12 radius $a$ and the frequency-dependent variable $k_1(f) = 2\pi f/v_{sc}$, where $f$ is the frequency and $v_{sc}$ is the bulk shear elastic wave velocity of the selected core material. These curves represent data for a waveguide having a pure fused silica cladding and Corning 7971 Ti doped fused silica core material, the latter having a 3.8 percent lower shear wave velocity than the former. For purposes of FIG. 3, the ratio $b/a$ has been assumed to be infinite. However, the curves for realistic values of $b/a$, such as $b/a = 3$, are quite similar to those shown.

Curve 31 in FIG. 3 represents the relative phase velocity $(v_p - v_{sc})/v_{sc}$ for the fundamental torsional mode $T_{01}$, $v_p$ being the torsional mode phase velocity. The relative phase velocity of the fundamental radial mode $R_{01}$ is very similar to curve 31. Curve 33 similarly represents the relative phase velocity for the fundamental shear mode $F_{11}$, with $v_p$ now being the shear mode phase velocity. These curves are significant in that they indicate the quality of guiding as a function of frequency. In particular, the frequency corresponding to $k_1(f)a \simeq 10$ in FIG. 3, i.e., $f \simeq 5v_{sc}/\pi a$ is the so-called cutoff frequency for the fundamental radial and torsional modes when the waveguide is comprised of the above-mentioned materials. Below this frequency, energy radiates into the cladding and the device ceases to act as a waveguide. We have not precisely determined the cutoff frequency for the fundamental i.e., the lowest guided, shear mode but, as shown in FIG. 3, it is certainly below $k_1(f)a \simeq 5$. For values of $k_1(f)a$ above the cutoff frequency of a mode, the guiding effect becomes stronger as the relative phase velocity becomes smaller. Advantageously, then, the fundamental shear mode of the present invention provides somewhat better guiding than the fundamental torsional and radial modes at any given frequency.

Curve 32 in FIG. 3 shows the relative group velocity $(v_g - v_{sc})/v_{sc}$ for the fundamental torsional mode, $v_g$ being the torsional mode group velocity. Again, the fundamental radial mode is very similar. Curve 34 shows the relative group velocity for the fundamental shear mode, with $v_g$ now being the shear mode group velocity. The slope of each of these curves at any given frequency indicates the dispersion of the signal wave at that frequency. Curve 32 undergoes a slope inversion at $k_1(f)a \simeq 13$; curve 34 at $k_1(f)a \simeq 10$. Dispersion is low near these points of slope inversion because curves 32 and 34 have zero slope thereat. Low dispersion means that all frequency components within the signal band propagate in the waveguide at substantially the same speed so that signal distortion is minimized. Advantageously, the low dispersion region for the fundamental shear mode extends over a larger range of $k_1(f)a$ than the low dispersion regions of the other modes, thus providing a wider frequency band of low dispersion operation.

In addition, it will be noted that the low dispersion region of the fundamental shear mode occurs at a lower band of values of $k_1(f)a$ than the low dispersion regions of the other fundamental modes (as well as those of higher order modes such as modes $T_{02}$ and $F_{12}$ shown in FIG. 3). This advantageously facilitates single mode excitation, particularly if circular symmetry is maintained across the waveguide and transducer 19 is well centered on the core axis. Moreover, for a desired frequency of operation, the core radius is smaller for the fundamental shear mode than the other modes. Stated alternatively, the operating frequency is lower for a given core radius. This allows the use of lower center frequencies in marginally flexible fibers so that propagation loss in the waveguide, which is frequency dependent, can be minimized. We have found that for wideband signals, the low end of the frequency band over which dispersion is within tolerable limits corresponds to $k_1(f)a \simeq 8$, for which the diameter $2a$ of core 12 is approximately 2.5 times the elastic energy wavelength $\lambda = v_{sc}/f$. For sufficiently narrow band signals, however, the guide may be operated at lower values of $k_1(f)a$. In such applications, the diameter of core 12 may be, for example, only twice (or even somewhat less than twice) the wavelength $\lambda$, corresponding to $k_1(f)a = 2\pi$, i.e., $f = v_{sc}/a$.

It is known that when the waveguide of FIG. 1 is excited in either radial or torsional modes, its energy propagation characteristics are not noticeably affected by the way in which the waveguide is structurally mounted or supported. This desirable feature, which is not found in many other types of acoustic waveguides, is believed to stem from the observed fact that the particle displacement profiles for the radial and torsional modes (which, incidentally, are substantially symmetric about the core central longitudinal axis), approach zero as the distance within the cladding away from the core increases.

Figure 4:
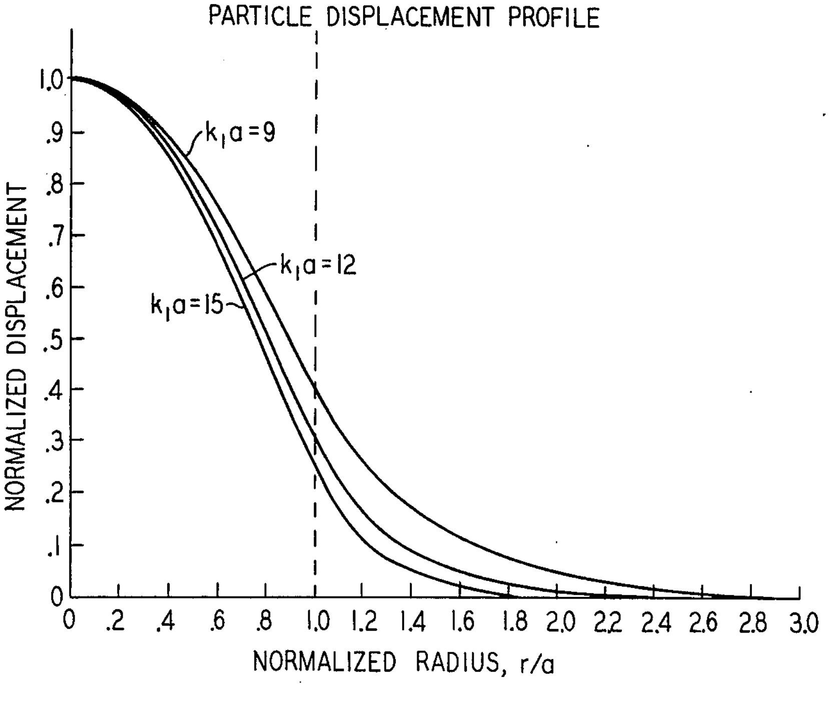
FIG. 4 depicts several fundamental shear mode particle displacement profiles for the waveguide of FIG. 1.

Advantageously, the particle displacement profiles of the waveguide of FIG. 1, when excited in the fundamental shear mode $F_{11}$, similarly approach zero in the cladding, as is shown in FIG. 4 for three values of $k_1(f)a$. Here, again, the ratio $b/a$ has been assumed to be infinite, but the profiles for realistic values of $b/a$ are quite similar. The data of FIG. 4, which are based on a 3.8 percent velocity difference, show that even when the guide is operated at a relatively low frequency, such as that corresponding to $k_1(f)a \simeq 9$ for wideband signals, the particle displacement at $b/a = 2$ is less than 10 percent of what it is at its maximum. Indeed, a ratio $b/a = 2$ may be adequate for short waveguides. Experiments have shown, however, that for longer guides having the 3.8 percent velocity difference, $b/a \geqq 3$ is required in order to obtain relatively distortionless, low-loss propagation over the full shear mode low dispersion bandwidth. (A velocity difference smaller than 3.8 percent, would, however, require a larger value of $b/a$, while a larger velocity difference would allow a smaller value.) We believe, on the other hand, that it is also desirable to use a cladding which is sufficiently thin that any higher order modes spuriously excited by the shear mode transducer will be selectively attenuated by cushioning medium 18 discussed below.

In order to support the waveguide of FIG. 1, and also to protect it from external mechanical shock which could fracture or otherwise seriously damage the waveguide, the latter is advantageously suspended in a cushioning medium 18 within a container 15. Selection of the cushioning medium is not critical. It can, for example, be a vibration-absorptive wax, such as sealing wax, or may be any of the many commercially available epoxy glues. Because of the aforementioned relationship between cladding region thickness and particle displacement, the medium does not significantly affect energy propagation in the waveguide except to absorb spurious signals in higher order modes, as previously mentioned. Alternatively, clamps could be used for support as long as they do not so crush the waveguide as to impose internal strains that could substantially distort the FIG. 4 particle displacement profile.

Figure 5:
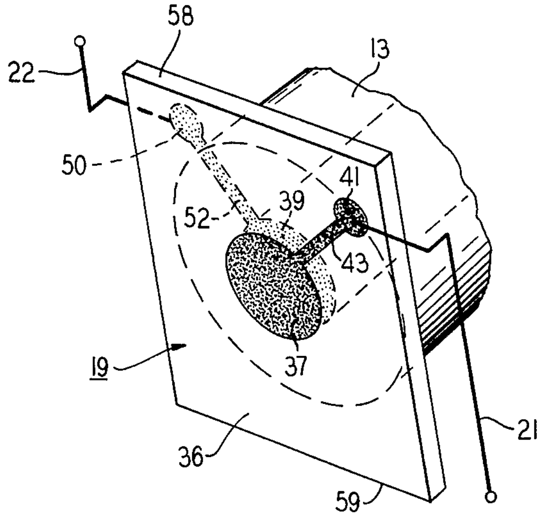
FIG. 5 illustrates a bulk shear wave transducer which can be used to excite and detect shear mode elastic waves in the waveguide of FIG. 1.
Figure 6:
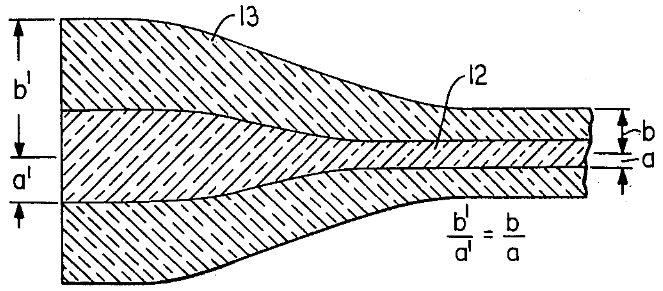
FIGS. 6, 7A, 7B, 8 and 9 illustrate other acoustic waveguide configurations in which the shear mode of the present invention can be excited and detected.

FIG. 5 illustrates a bulk shear wave transducer which can be used to excite the fundamental shear mode of the waveguide of FIG. 1. The transducer comprises a plate 36 which may be of X-cut lithium niobate with the X axis normal to the face of the plate. Alternatively, it may be of a piezoelectric ferroelectric ceramic material such as the mixture lead zirconate titanate commonly designated PZT-5A by the Clevite Corporation and other manufacturers. Plate 36, if of PZT-5A, must have been previously poled in the plane of the plate. It can be purchased already poled or may be poled prior to being affixed to the waveguide in a manner well known in the art by applying a voltage of appropriate magnitude and duration along the length of a pair of opposite edges of the plate, such as edges 58 and 59. Once poled, the plate will remain poled indefinitely as long as it is not heated above its Curie temperature.

Plate 36 is centered on the waveguide central longitudinal axis and extends laterally somewhat beyond the periphery of cladding 13. Drive electrodes 37 and 39 are applied to the exposed and waveguide sides of the plate, respectively. Each electrode covers essentially the circular projection of the core 12 cross section.

Transducer 20 may be substantially identical to transducer 19, and electrical connections for both exciting ("launching") and detecting the shear mode waves are made in similar ways. Thus, for purposes of driving the waveguide, leads 21 and 22 from driver 10 are coupled to electrodes 37 and 39, respectively, by way of connection pads 41 and 50 and respective lead paths 43 and 52. Advantageously, the transducer of FIG. 5 is more inexpensive and is easier to fabricate than transducers for the radial and torsional modes such as those disclosed in the Boyd-Coldren patent.

FIGS. 6, 7A, 7B, 8 and 9 illustrate other acoustic waveguide configurations in which the shear modes of the present invention and, in particular, the fundamental shear mode, can be excited and detected by the use of appropriate transducers. Thus, for example, waveguides in some high frequency ranges may be so small that the application of transducers is difficult. In such cases, the ends of the guide may be formed with an enlarged tapering diameter as illustrated in the longitudinal cross-sectional view of FIG. 6. If the waveguide is formed in a fiber drawing operation, for example, the tapered ends are naturally formed. The core and cladding radii may remain in the same proportion ($b'/a' = b/a$) at any of the taper transverse cross sections as in the main part of the guide. It has further been found that the waveguide electrical input impedance looking into the transducer (not shown in FIG. 6) is a function of the core diameter. Consequently, an appropriate selection of taper transverse cross section yields an input impedance that matches the driving, or receiving, circuit impedance.

Figure 7A:
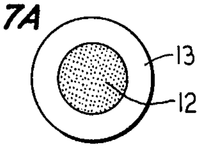
Figure 7B:
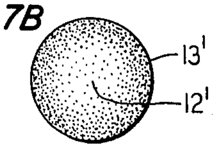

Although the waveguide of FIG. 1 has discrete core and cladding regions, with the cladding region doped to provide the desired velocity differences, the guide need not always be formed in that fashion. FIG. 7A illustrates a cross section of the waveguide with the discrete central core 12 and outer cladding 13. Either core or cladding or both can be doped to secure a desired velocity difference but homogeneous core doping is schematically illustrated. Also, different compatible materials can be used in the core 12 and cladding 13 to effect the desired velocity difference. FIG. 7B illustrates one alternative arrangement in which an otherwise homogeneous elongated fiber member is doped so as to produce a concentration in the cladding region 13' which is graded such that the dopant has a lower concentration in the inner portions of the cladding region. Illustrative materials for this embodiment are a $Gd_3Ga_5O_{12}$ fiber doped with Ni.

A further possibility is to start with a homogeneous single crystal fiber member and transforming all or a portion of the crystal structure of the cladding region to a higher velocity material, again as symbolically represented in FIG. 7B. The core fiber may be comprised, for example, of a garnet material such as $Gd_3Ga_5O_{12}$ (GGG), the garnet family advantageously exhibiting an order of magnitude less attenuation for acoustic waves than, for example, fused silica. The cladding region is then formed by utilizing solid solution diffusion techniques, for example, to diffuse yttrium (Y) or any other lighter element compatible with the garnet structure, into the GGG fiber. This forms a waveguide of variable composition garnet with the cladding region having a substantial concentration of the garnet material $Y_3Ga_5O_{12}$ (YGG), which has a higher shear wave velocity than GGG, the yttrium having partially replaced the gadolinium (Gd) in the crystal structure. Alternatively, iron (Fe) or aluminum (Al) may be diffused into the GGG core to provide a higher-velocity cladding having a substantial concentration of the garnet materials $Gd_3Fe_5O_{12}$ or $Gd_3Al_5O_{12}$, respectively. Or, a yttrium diffusion can be followed by an iron or aluminum diffusion to provide a cladding having a substantial concentration of the garnet materials $Y_3Fe_5O_{12}$ (YIG) or $Y_3Al_5O_{12}$ (YAG), respectively.

Figure 8:
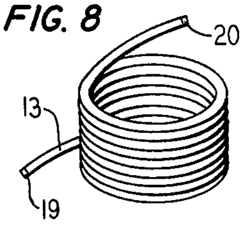

In fabricating transmission paths with long delay, a straight waveguide as illustrated in FIG. 1 may be inconvenient. Advantageously, however, the frequency ranges of practical interest usually dictate small guide diameters. Thus, the clad waveguide can be coiled either by itself or around another suitable object to conserve space. Such a coiled waveguide arrangement is illustrated in FIG. 8. The principal precaution to be observed is that the radius of curvature of the bend in the waveguide should be kept large enough to avoid the introduction of significant disturbances in the energy being propagated through the waveguide.

Figure 9:
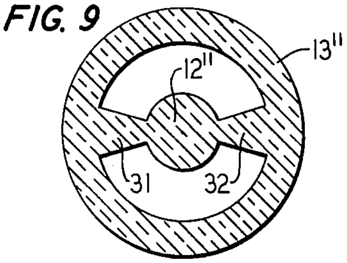

FIG. 9 depicts in cross section another embodiment of a waveguide in which shear mode waves may be able to be propagated. Here, the core and enclosing regions are spaced apart. The material is entirely homogenous with a small wedge shaped membrane supporting the central rod which is the waveguide. Mechanical properties of the structure are utilized to focus energy toward the core. This embodiment has the disadvantages that fabrication is more complex than in previously discussed embodiments, and the waveguide should be evacuated to avoid air loading. However, this guide is formed of a single material, and it illustrates a different technique for containing the elastic waves in a central core to enable noninterfering support.

In FIG. 9 a central core member 12″ is supported within, but spaced from, an enclosing, or cladding tube member 13″. Spacing is achieved by diametrically opposed longitudinally extending ribbons 31 and 32. All of the elements 12″, 13″, 31 and 32 are advantageously of pure fused silica. Ribbons 31 and 32 extend along the full length of core 12″ and are tapered down to a thickness much smaller than the core diameter adjacent to the core surface so that the ribbon subtends a small angle on the core. Tapering of support ribbons as shown makes the structure less rigid next to the core than at the tube and focuses particle motion toward core 12″.

Although the present invention has been described in connection with particular embodiments, it is to be understood that additional embodiments, modifications, and applications including those disclosed in the Boyd-Coldren patent as well as those which will be obvious to those skilled in the art, fall within the spirit and scope of the invention.

What is claimed is:

1. In combination,
   - a waveguide for elastic waves comprising, a core region having a central longitudinal axis, said core region being of a material in which bulk elastic waves can be propagated, and a cladding region enclosing all surfaces except end surfaces of said core region, said cladding region also being of a material in which bulk elastic waves can be propagated, at least one of said core and cladding regions including means for focusing elastic wave energy toward said core region, and
   - means for launching bulk elastic waves in said waveguide in a mode in which the principal particle displacement is substantially perpendicular to a plane through said axis, the diameter of said core region being at least twice the wavelength of the lowest frequency component of said elastic waves.

2. The combination of claim 1 in which the frequency of said lowest frequency component is at least $v_{sc}/a$ where $v_{sc}$ is the bulk shear wave velocity of said core region and $a$ is its radius.

3. In combination,
   - an elongated member of a material in which elastic waves can be propagated, said member having an approximately circular cross section and a central longitudinal axis,
   - a cladding on all surfaces except end surfaces of said member, said cladding also being of a material in which elastic waves can be propagated,
   - the materials of said elongated member and said cladding being sufficiently different in character to have different bulk shear wave velocities with said elongated member having the lower such velocity so said member and cladding comprise a waveguide for elastic waves,
   - said cladding having a substantially uniform radial thickness which is a finite value dependent upon the particle displacement profile of the combined member and cladding materials, said thickness being large enough so that said profile falls substantially to zero at a waveguide radius which is no greater than the outer radius of said cladding, and
   - means at at least one end of said waveguide for electromechanically transducing between time-varying signals and elastic displacement signals in said waveguide, said elastic displacement signals being in a mode in which the principal particle displacement is perpendicular to a plane passing through said axis.

4. The combination in accordance with claim 3 wherein said time-varying signals are electrical signals.

5. The combination in accordance with claim 4 in which said elongated member material is fused silica doped with titanium dioxide in sufficient percentage to provide said lower bulk shear wave velocity and said cladding material is fused silica.

6. The combination in accordance with claim 4 in which said elongated member material is fused silica, and said cladding material is fused silica doped with a sufficient percentage of alumina to provide said bulk shear wave velocity difference.

7. The combination in accordance with claim 4 in which said elongated member is a single crystal material.

8. The combination in accordance with claim 4 in which said waveguide is suspended in a motion absorbing material for cushioning said waveguide to protect it against external mechanical shock.

9. The combination in accordance with claim 4 in which the outside diameter of said cladding is at least twice the outside diameter of said elongated member.

10. The combination in accordance with claim 4 in which said elongated member and said cladding thereon have a particle displacement profile with respect to waveguide radius during propagation of said elastic displacement signals, said profile being substantially symmetrical about said axis and having a maximum displacement region within said elongated member.

11. The combination in accordance with claim 4 in which said waveguide includes end portions of substantially enlarged cross sectional diameter as compared to an intermediate portion of said waveguide, and the cross sectional diameter of said waveguide is gradually tapered between each of said end portions and said intermediate portion.

12. The combination in accordance with claim 4 in which said transducing means comprises a member of piezoelectric material in contact with said one end, and electrode means secured to said piezoelectric member for bidirectionally coupling electric fields corresponding to either said electrical signals for one direction of transducing or said elastic signals for the other direction of transducing.

13. The combination in accordance with claim 12 in which said piezoelectric member is a plate of ferroelectric ceramic material, said plate being electrically polarized in a linear direction in the plane of the plate and said electrode means comprises electrodes arranged for coupling said electric field in a direction normal to the plane of the plate.

14. The combination in accordance with claim 4 in which said member material and said cladding material are the same except that at least one thereof is doped with a sufficient percentage of a different material to produce said bulk shear wave velocity difference.

15. The combination in accordance with claim 14 in which said doping percentage concentration is graded with respect to waveguide radius over at least a portion of the radius of said waveguide to provide a relatively smooth transition between said different shear wave velocities.

16. The combination in accordance with claim 15 in which said doping percentage concentration is graded from a maximum concentration at the outer surface of said cladding to reduced concentrations with decreasing radii.

17. The combination in accordance with claim 4 in which said elongated member and said cladding are each comprised of a garnet material.

* * * * *